United States Patent [19]
Ohsawa

[11] 3,974,453
[45] Aug. 10, 1976

[54] STEREOPHONIC SIGNAL DEMODULATOR FOR A PAIR OF COMPOSITE SIGNALS WITH DIFFERENT AC SIGNAL LEVELS AND THE SAME DC SIGNAL LEVEL

[75] Inventor: Mitsuo Ohsawa, Fujisawa, Japan

[73] Assignee: Sony Corporation, Tokyo, Japan

[22] Filed: Feb. 10, 1975

[21] Appl. No.: 548,737

[30] Foreign Application Priority Data
Feb. 15, 1974  Japan................................ 49-18779
Feb. 15, 1974  Japan................................ 49-18780

[52] U.S. Cl............................. 329/50; 179/15 BT; 325/472; 329/103; 329/112; 329/122; 329/129; 329/147; 329/204
[51] Int. Cl.²..................... H03D 3/18; H03D 3/24; H04H 5/00
[58] Field of Search............. 329/50, 103, 112, 129, 329/147, 204, 122; 179/15 BT; 325/472

[56] References Cited
UNITED STATES PATENTS
3,538,259  11/1970  Brahman......................... 179/15 BT
3,617,641  11/1971  Fiet et al......................... 179/15 BT
3,714,595  1/1973  Denenberg et al. ............... 329/50 X

*Primary Examiner*—Siegfried H. Grimm
*Attorney, Agent, or Firm*—Lewis H. Eslinger; Alvin Sinderbrand

[57] ABSTRACT

A stereophonic signal demodulator includes a frequency discriminator which produces a pair of composite stereo signals in response to an FM stereophonic signal applied thereto, the pair of composite stereo signals having opposite polarities to each other. A pair of stereo demodulators is supplied with at least one of the pair of composite stereo signals to produce left and right channel audio signals therefrom, respectively. The other of the pair of composite stereo signals is reduced in amplitude and is supplied to a pair of adders whereat it is correspondingly summed with the respective left and right channel audio signals to eliminate crosstalk components contained therein. In one embodiment, the reduced amplitude composite stereo signal is supplied to the respective adders by a further pair of stereo demodulators. One example of a stereo demodulator comprises a switching-type demodulator having a carrier leak suppression effect.

14 Claims, 12 Drawing Figures

STEREOPHONIC SIGNAL DEMODULATOR FOR A PAIR OF COMPOSITE SIGNALS WITH DIFFERENT AC SIGNAL LEVELS AND THE SAME DC SIGNAL LEVEL

BACKGROUND OF THE INVENTION

1. Field of the Invention

This invention relates generally to a stereophonic signal demodulator, and is directed more particularly to an FM stereophonic signal demodulator of relatively simple circuit construction wherein a crosstalk component in the respective output signals can be substantially entirely eliminated.

2. Description of the Prior Art

In the prior art, there have been proposed a number of FM stereophonic signal demodulators including crosstalk elimination circuits. In a typical prior art demodulator, left and right channel audio signals are demodulated, respectively, to produce left and right channel signals $2L + \Delta R$ and $2R + \Delta L$, respectively. The component $\Delta R$ represents a crosstalk component of the right channel that is present in the left channel output signal and, similarly, the component $\Delta L$ represents a crosstalk component in the right channel output signal. Heretofore, these crosstalk components have been eliminated by adding a portion of the main channel signal (L+R) of the received composite stereo signal to the demodulated signals in reverse phase. If the signal demodulator is of the type which includes switching circuits, then the crosstalk elimination circuit must be specifically designed to reduce carrier leakage which may be produced in the demodulator switching circuit.

Crosstalk may be significantly reduced if a pair of composite stereo signals of opposite phase are derived by a phase division type of amplifier from the composite stereo signals produced by an FM discriminator, and if this pair of signals is supplied to a pair of switching-type demodulators to thereby demodulate signals $2L+\Delta R$, $2R+\Delta L$, $-(\Delta R+\Delta\Delta L)$ and $-(\Delta L+\Delta\Delta R)$, respectively. Then, if corresponding ones of these demodulated signals are added to reduce the crosstalk components $\Delta R$ and $\Delta L$, signals $2L-\Delta\Delta L$ and $2R-\Delta\Delta R$ are produced. However, this technique requires the use of the phase division type of amplifier, which normally is formed of two transistor amplifiers having a variable resistor connected between the emitter electrodes. This is a rather complicated circuit construction and lowers the S/N ratio of the composite stereo signal because of the amplifier stage.

OBJECTS OF THE INVENTION

Therefore, it is an object of this invention to provide an improved stereophonic signal demodulator wherein the defects inherent in prior art systems are avoided.

Another object of the invention is to provide an FM stereophonic signal demodulator having an improved S/N characteristic and wherein an output signal from a frequency discriminator is supplied without an amplifier to a stereophonic demodulator.

A further object of the invention is to provide an FM stereophonic signal demodulator including a pair of switching-type demodulators wherein undesired leakage of the switching signal into the demodulated output signal is avoided.

Another object of this invention is to provide an FM stereophonic signal demodulator wherein undesired crosstalk components are substantially entirely eliminated from the demodulated output signals.

An additional object of this invention is to provide a stereophonic signal demodulator wherein composite stereo signals are demodulated to produce respective channel audio signals having substantially no crosstalk components therein.

Various other objects and advantages of the invention will become apparent from the forthcoming detailed description, and the novel features will be particularly pointed out in the appended claims.

SUMMARY OF THE INVENTION

In accordance with this invention a pair of composite stereo signals of opposite polarity and different signal levels are derived from an FM discriminator; at least one of the pair of composite stereo signals is supplied to a pair of stereo demodulators from which the respective left and right channel audio signals are produced; the other composite stereo signal is correspondingly added to the respective demodulated left and right channel audio signals to eliminate crosstalk components from the demodulated signals. In one embodiment, the other composite signal has the reduced signal level and is supplied to a second pair of stereo demodulators, the respective demodulated output signals of the second pair of demodulators being added to corresponding ones of the respective left and right channel audio signals.

BRIEF DESCRIPTION OF THE DRAWINGS

The following detailed description will best be understood in conjunction with the accompanying drawings, wherein.

DETAILED DESCRIPTION OF CERTAIN ONES OF THE PREFERRED EMBODIMENTS

Figure 1:
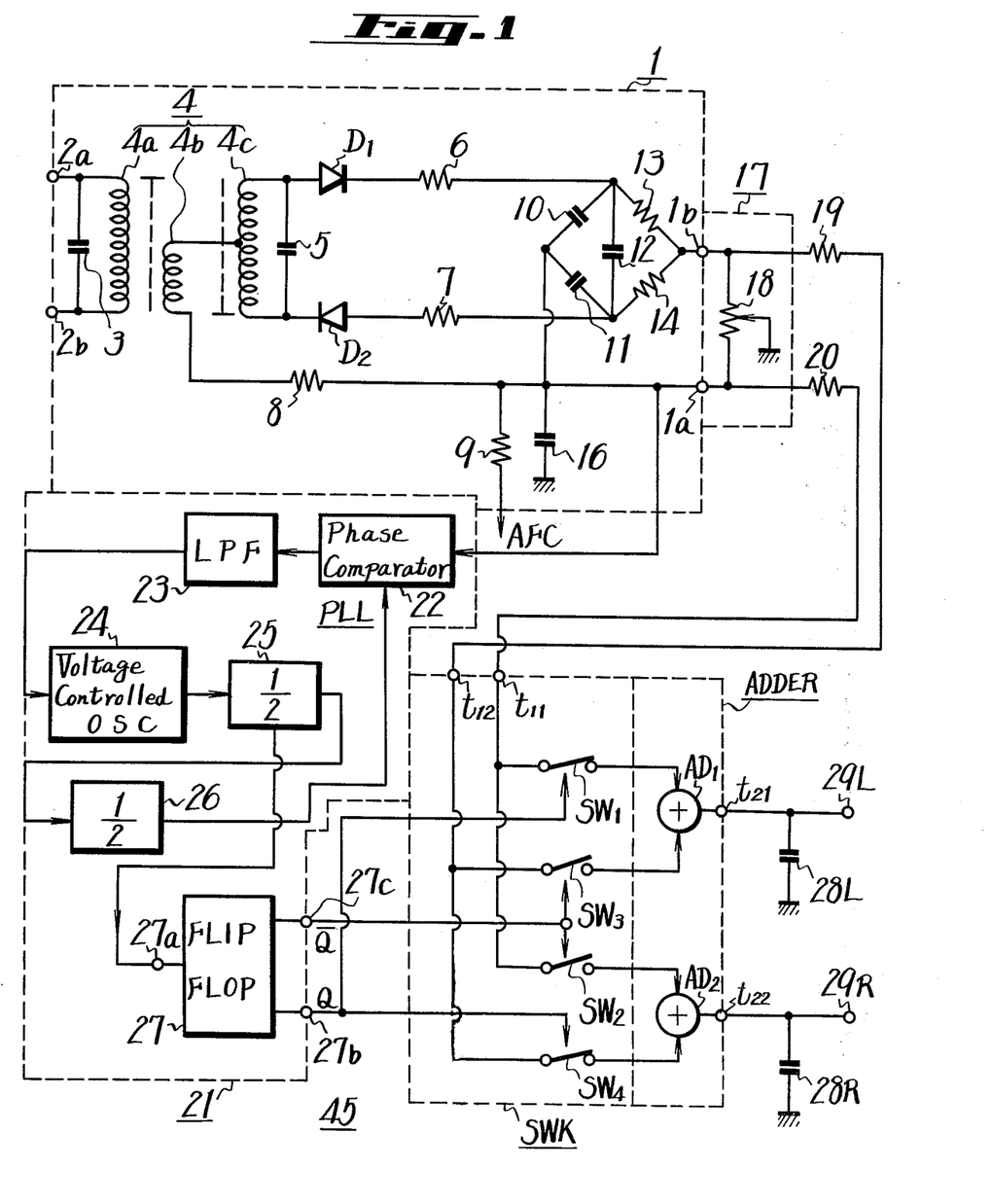
FIG. 1 is a circuit diagram showing one embodiment of this invention.

An embodiment of this invention will now be described in detail with reference to FIG. 1. In FIG. 1 a frequency discriminator is shown as the block 1 and is formed as a ratio detecting circuit in th illustrated example. Input terminals $2a$ and $2b$ for the frequency discriminator are supplied with a carrier which is frequency-modulated with a composite stereo signal including a main channel signal, a pilot signal, which may have a frequency of, for example, 19KHz, and a subchannel signal which is amplitude-modulated on a carrier of the second harmonic of the pilot signal. Output terminals $1a$ and $1b$ of the frequency discriminator are provided, from which two composite stereo signals of opposite polarities are obtained.

The frequency discriminator circuit 1 is comprised of a transformer 4 formed with three coils 4a, 4b and 4c. Opposite ends of the coil 4a are connected to the input terminals 2a and 2b for receiving an FM stereophonic signal, and a capacitor 3 is connected thereacross. A capacitor 5 is connected across both ends of the coil 4c. A tap is provided at the mid-point of the coil 4c and is connected by the coil 4b to the output terminal 1a through a resistor 8. An automatic frequency control signal can be obtained from the output terminal 1a through a resistor 9. The coils 4a, 4c and the capacitors 3 and 5 form a doubly tuned circuit whose tuning frequecny is selected to be the frequency of a carrier signal of the frequency-modulated signal.

Diodes $D_1$ and $D_2$ are connected to opposite ends of the coil 4c in opposite polarity, respectively, and resistors 6 and 7 are respectively connected to the diodes $D_1$ and $D_2$ in series. One end of the coil 4c is connected through the series connection of the diode $D_1$, the resistor 6 and further through series-connected resistors 13 and 14 to resistor 7, diode $D_2$ and the other end of the coil 4c. The junction defined by the series-connected resistors 13 and 14 is coupled to an output terminal 1b. A capacitor 12 is connected across the series-connected resistors 13 and 14 and a further series circuit formed of capacitors 10 and 11 is connected in parallel therewith. The connection point between the capacitors 10 and 11 is connected to the output terminal 1a which is coupled to a reference potential, such as ground, by a capacitor 16.

The aforedescribed frequency discriminator is seen to be a ratio detector and operates to demodulate the frequency-modulated signals supplied to the input terminals 2a and 2b so as to produce, at the output terminals 1a and 1b, output signals of opposite polarities relative to ground. The output signals comprise composite stereo signals.

The output signals produced by the FM discriminator circuit 1 are applied to a level adjusting circuit 17 which establishes the level ratio of the two opposite polarity composite stereo signals at a predetermined value. In the illustrated example in FIG. 1, the level adjusting circuit 17 comprises an adjustable resistor, such as a potentiometer 18, connected across the output terminals 1a and 1b and having an adjustable contact, such as a movable tap, coupled to ground. By adjusting the movable tap of the potentiometer 18, the level ratio of the opposite polarity composite signals is set. Thus, the relative amplitudes of the composite signals are determined.

A stereo signal demodulator circuit 45, which is supplied with the output signals comprised of the composite stereo signals produced by the FM discriminator circuit 1, is adapted to demodulate the composite signals into left and right channel audio signals. The stereo signal demodulator circuit 45 is comprised of a switching circuit SWK, which is supplied with the composite stereo signals from the FM discriminator circuit 1, and a subcarrier signal generating circuit 21 which controls the switching operation of the switching circuit SWK. The switching circuit SWK includes switching elements $SW_1$, $SW_2$, $SW_3$ and $SW_4$. The switching elements $SW_1$ and $SW_2$ are supplied with one of the composite signals from the FM discriminator circuit 1 and produce left and right channel audio signals, respectively. For the purpose of this description, the switching elements $SW_1$ and $SW_2$ may be considered as main switching elements.

As shown, the output terminal 1a of the FM discriminator circuit is connected through a resistor 20 to an input terminal $t_{11}$ of the switching circuit SWK. This input terminal $t_{11}$ is connected in common to the switching elements $SW_1$ and $SW_2$.

The switching elements $SW_3$ and $SW_4$ included in the switching circuit SWK serve as sub-switching elements for a purpose soon to be described. The output terminal 1b of the FM discriminator circuit 1 is connected through a resistor 19 to an input terminal $t_{12}$ of the switching circuit SWK. This input terminal $t_{12}$ is connected in common to the switching elements $SW_3$ and $SW_4$.

The output signals from the switching elements $SW_1$ and $SW_3$ are supplied to an adder $AD_1$ of an adding circuit and are added therein. The output signals from the switching elements $SW_2$ and $SW_4$ are supplied to an adder $AD_2$ of the adding circuit and are added therein. As will soon become apparent, the signals from the switching elements $SW_3$ and $SW_4$ act as correcting signals to cancel crosstalk components included in the left and right channel audio signals. Output terminals $t_{21}$ and $t_{22}$ are connected to the output sides of the adders $AD_1$ and $AD_2$ to receive the left and right channel audio signals which are substantially free of unwanted crosstalk components. The output terminals $t_{21}$ and $t_{22}$ are connected to output terminals 29L and 29R to deliver the left and right channel audio signals thereat, respectively. The output terminals 29L and 29R are coupled to ground by capacitors 28L and 28R, respectively.

The respective switching elements $SW_1$–$SW_4$ in the switching circuit SWK are selectively actuated and deactuated by subcarrier signals produced by the subcarrier signal generating circuit 21 in a manner such that when the switching elements $SW_1$ and $SW_4$ are actuated, or turned on (closed in the drawing), the switching elements $SW_2$ and $SW_3$ are deactuated, or turned off (opened in the drawing). This operation of the switching elements alternates repetitively.

A typical embodiment of the subcarrier signal generating circuit 21 now will be described. The circuit 21 includes a phase-locked loop PLL and a flip-flop circuit 27. The phase-locked loop PLL comprises a phase comparator 22 which is supplied with the composite stereo signal produced at the output terminal 1a of the FM discriminator circuit 1 and with another signal to be described. The output signal from the phase comparator is applied through a low pass filter 23 to a voltage controlled oscillator 24. In this embodiment the oscillating frequency of the oscillator is selected as the fourth harmonic of the pilot signal included in the composite stereo signal supplied to the frequency discriminator 1. As a numerical example, the oscillator 24 may have a frequency of 76KHz. The output signal from the voltage controlled oscillator 24 is the other signal supplied to the phase comparator 22, and is supplied thereto through frequency dividers 25 and 26 which are connected in series. Each of the frequency dividers is a divide-by-two circuit so that the frequency of the signal applied to the phase comparator by the frequency divider 26 is one-fourth the controlled oscillator frequency, i.e., equal to the pilot signal frequency.

The output signal from the frequency divider 25 is also applied to the input terminal 27a of a flip-flop circuit 27. The flip-flop circuit has two output terminals 27b and 27c whereat output signals Q and $\bar{Q}$ of opposite polarity (i.e., 180° out of phase) are produced. The output signal Q at the output terminal 27b is supplied as a switching signal to control the switching elements $SW_1$ and $SW_4$; while the output signal $\bar{Q}$ at the output terminal 27c is supplied as a switching signal to control the switching elements $SW_2$ and $SW_3$. The flip-flop circuit 27 is conventional and produces the switching signals in synchronism with the output of the divider 25. Hence, each switching signal has a frequency equal to the second harmonic of the pilot signal frequency.

Figure 3:
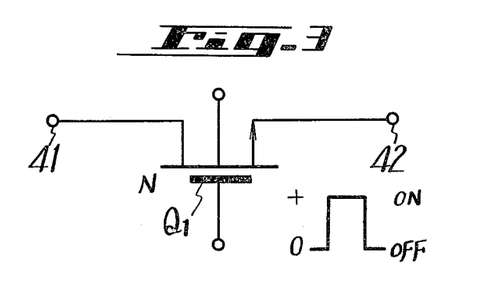
FIG. 3 is a diagram showing one embodiment of the switching elements which can be used as the stereo demodulator in the embodiments shown in FIGS. 1 or 2.

In one embodiment, the respective switching elements $SW_1$–$SW_4$ of the switching circuit SWK comprise MOS-type field effect transistors (hereinafter referred to as a MOS FET). As an example, the MOS FET may be an N-channel enhancement type MOS FET as shown as $Q_1$ in FIG. 3. In FIG. 3, terminals 41 and 42 correspond to the input and output terminals of a switching element. If the N-channel enhancement type MOS FET $Q_1$ is supplied at its gate with a positive pulse (as shown), it is actuated (turned on) positive when the potential of the pulse exceeds a predetermined level, and deactuated (turned off) when the gate potential is reduced to zero (relative to the source).

Figure 5:
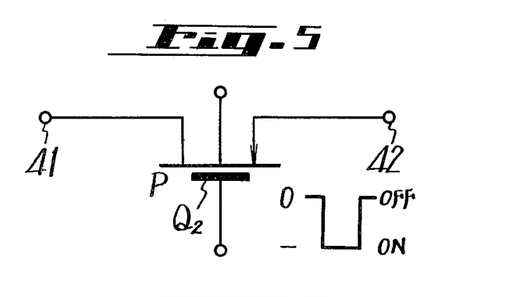
FIGS. 5, 6, 7 and 8 are diagrams showing further embodiments of the switching elements which can be used as the stereo demodulator in the invention.

In an alternative embodiment, the switching elements $SW_1$–$SW_4$ may comprise a P-channel enhancement type MOS FET $Q_2$ shown in FIG. 5. In this alternative embodiment, $Q_2$ is actuated by a negative polarity switching pulse applied to its gate and is deactuated when the gate potential is reduced to zero, as depicted in FIG. 5.

Figure 6:
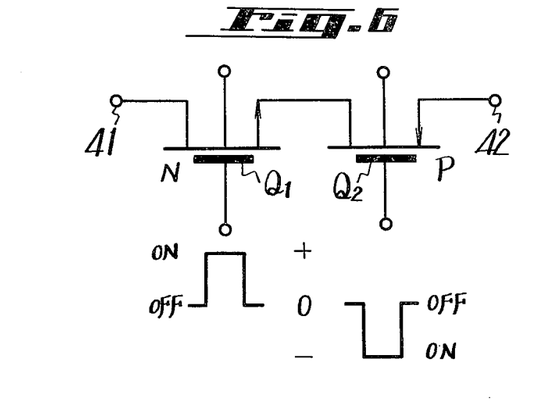

In a still further embodiment, instead of using one MOS FET as shown in FIGS. 3 and 5, each of the switching elements $SW_1$–$SW_4$ may comprise two MOS FETs $Q_1$ and $Q_2$ of different channel types connected in series as shown in FIG. 6.

Figure 7:
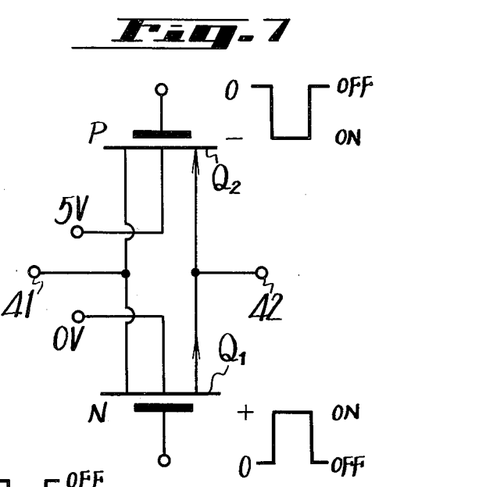

In a further embodiment, as shown in FIG. 7, each switching element may comprise two MOS FETs $Q_1$ and $Q_2$ of different channel types connected in parallel.

Figure 8:
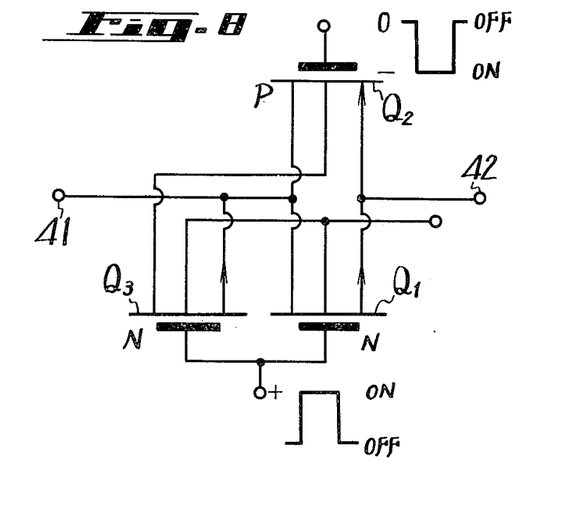

In yet another embodiment, a further combination of MOS FETs may be used to comprise each of the switching elements $SW_1$–$SW_4$. As shown in FIG. 8 two MOS FETs $Q_1$ and $Q_2$ of different channel types are connected in parallel, and another N-channel enhancement type MOS FET $Q_3$ is connected to the parallel combination in the configuration whereby its source is connected to the input terminal 41 and its drain is connected to the back plate of the MOS FET $Q_2$. In this embodiment the back plates of the MOS FETs $Q_1$ and $Q_3$ are connected together.

The operation of the stereo signal demodulator circuit shown in FIG. 1 will now be described. If $e_i$ represents the composite stereo signal produced by the discriminator circuit 1, then the composite stereo signal obtained at the output terminal 1a may be represented as $(1-(1/k))e_i$, while the composite stereo signal obtained at the output terminal 1b may be represented as $(-(1/k)e_i)$. It is seen that this pair of composite stereo signals has opposite polarities and if $k$ is the level ratio established by the variable resistor 18 ($k>1$), then the signal level of the composite stereo signal of the output terminal 1b is reduced in comparison to that at the output terminal 1a. These stereo composite signals obtained at the output terminals 1a and 1b are fed to the input terminals $t_{11}$ and $t_{12}$, respectively, of the switching circuit SWK. When the switching elements $SW_1$ and $SW_2$ of the switching circuit SWK are alternately actuated (e.g., switched ON and OFF) by the output signal from the subcarrier signal generating circuit 21, the signal $(1-1/k)e_i$ is demodulated to derive the left and right channel audio signals at the output sides of the respective switching elements $SW_1$ and $SW_2$. However, the respective left (L) and right (R) channel audio signals contain crosstalk components $\Delta R$ and $\Delta L$ of the opposite channel, respectively. Thus, the audio signal obtained from the switching element $SW_1$, including the crosstalk component, is expressed as $2R+\Delta L$, respectively.

It is appreciated that the switching element $SW_3$ is supplied with the same subcarrier switching signal which is used to actuate the switching element $SW_2$. Similarly, the switching element $SW_4$ is supplied with the same subcarrier switching signal which is used to actuate the switching element $SW_1$. Therefore, a right channel audio signal component is produced by the switching element $SW_3$ which is switched on and off, and a left channel audio signal component is produced by the switching element $SW_4$ which is alternately switched on and off. Now, if the level adjusting circuit 17 is set to determine the level ratio $k$, the right channel audio signal component produced by demodulating the composite stereo signal $-1/ke_i$ by the switching element $SW_3$ is substantially equal to $-\Delta R$. In a like manner, the composite stereo signal $-1/ke_i$ is demodulated by the switching element $SW_4$ to produce a left channel audio signal component $-\Delta L$. Thus, it is seen that the switching elements $SW_4$ and $SW_3$ are adapted to produce reduced amplitude versions of the left and right channel audio signals produced by the switching elements $SW_1$ and $SW_2$, respectively. The absolute value of such reduced amplitude versions can be made substantially equal to the level of the crosstalk components of the main switching elements by suitably adjusting the level adjusting circuit.

The signal $-\Delta R$ produced by the switching element $SW_3$ is added in the adder $AD_1$ to the left channel audio signal $2L+\Delta R$ produced by the switching element $SW_1$ to cancel the crosstalk component $\Delta R$ from the left channel audio signal. Similarly, the signal $-\Delta L$ produced by the switching element $SW_4$ is added in the adder $AD_2$ to the right channel audio signal $2R+\Delta L$ produced by the switching element $SW_2$ to cancel the crosstalk component $\Delta L$ from the right channel audio signal. The output of the adder $AD_1$ is supplied to the left channel output terminal 29L as the left channel audio signal 2L having no crosstalk component. The output of the adder $AD_2$ is supplied to the right channel output terminal 29R as the right channel audio signal 2R having no crosstalk component.

Figure 4A:
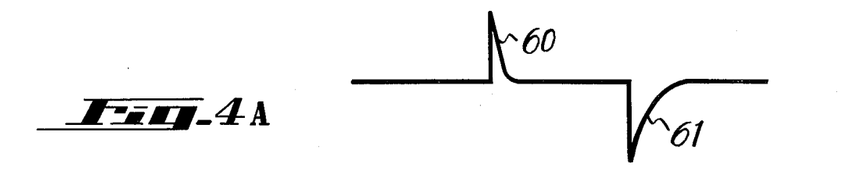
FIGS. 4A, 4B and 4C are waveform diagrams which are helpful to explain the operation of the switching circuits which can be used with the invention.
Figure 4B:
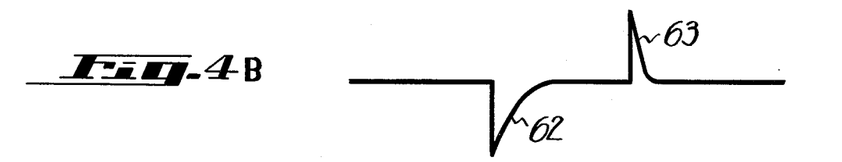
Figure 4C:
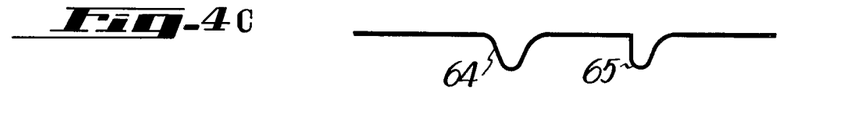

In the embodiment of FIG. 1 the switching elements $SW_1$–$SW_4$ have been assumed to be comprised of FETs. Accordingly, when they are actuated and deactuated, differentiated pulses are produced due to the stray capacity between the respective electrodes of the FETs. For example, when the MOS FET $Q_1$ shown in FIG. 3 is actuated, or switched ON, a positive differentiated pulse 60 shown in FIG. 4A is produced; while when the MOS FET $Q_1$ is deactuated, or switched OFF, a negative differentiated pulse 61 shown in FIG. 4A is produced. If the differentiated pulses shown in FIG. 4A represent the operation of, for example, the switching element $SW_1$, then, concurrently, the switching element $SW_3$ is changed from its ON-state to its OFF-state to produce a negative differentiated pulse 62 shown in FIG. 4B, while when the switching element $SW_3$ changes from its OFF-state to its ON-state, a positive differentiated pulse 63 shown in FIG. 4B is produced. Since the switching elements $SW_1$ and $SW_3$ are alternately actuated and deactuated, the pulses 60 and 62 and the pulses 61 and 63 are respectively coincident. If the pulses shown in FIG. 4A are produced by the switching element $SW_1$, then the pulses shown in FIG. 4B are produced by the switching element $SW_3$; and these pulses are added in the adder $AD_1$ to lower their level, as shown at 64 and 65 of FIG. 4C. Also, if the switching elements $SW_2$ and $SW_4$ produce the pulses shown in FIGS. 4A and 4B, respectively, then adder $AD_2$ adds these pulses to reduce their level to 64 and 65 of FIG. 4C.

With the FM stereo demodulator circuit shown in FIG. 1, composite stereo signals of opposite polarity are derived from the FM discriminator circuit 1 and exhibit the predetermined level ratio established by the level adjusting circuit 17. These opposite polarity, different level composite stereo signals are then applied to the switching circuit SWK and demodulated to left and right audio signals with no crosstalk components. Therefore, by this invention there is no need to provide an amplifier to cancel the crosstalk components as is required by the prior art. Rather, sub-switching elements $SW_3$ and $SW_4$ are provided to produce signals which, when added to the signals produced by the main switching elements $SW_1$ and $SW_2$, cancel the crosstalk components in the left and right channel audio signals. This arrangement not only cancels the crosstalk components but also cancels the differentiated pulses which are produced due to the stray capacity between the electrodes of the MOS FETs which are used as the switching elements.

Another embodiment of this invention will now be described with reference to FIG. 2 wherein like reference numerals are used to identify the same components previously described with respect to FIG. 1. In the interest of brevity, further description of these components is not provided.

Figure 2:
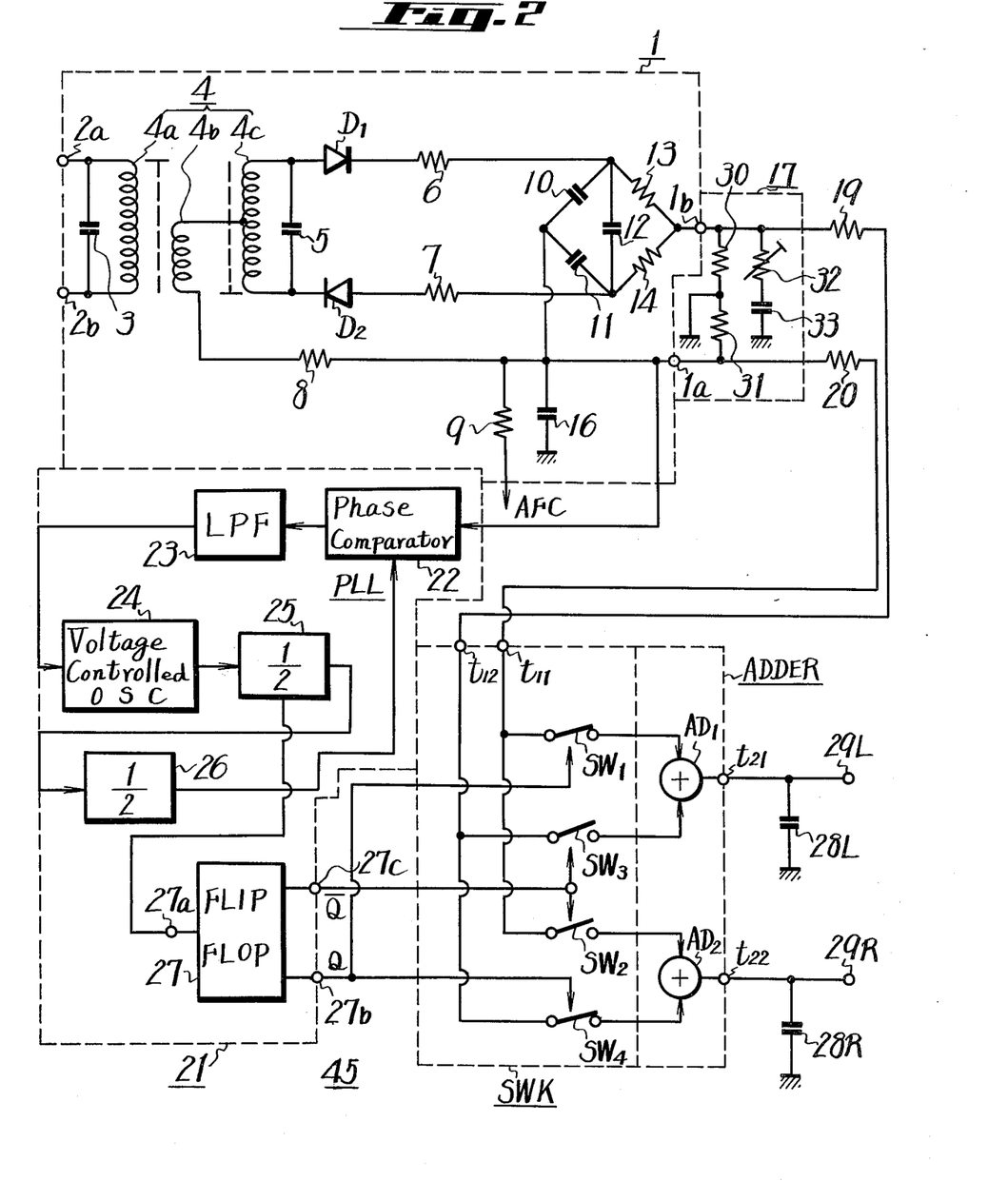
FIG. 2 is a circuit diagram showing another embodiment of the invention.

The level adjusting circuit 17 of the embodiment shown in FIG. 2 differs from that shown in FIG. 1 in that the FIG. 2 embodiment is such that the two opposite polarity composite stereo signals derived from the FM discriminator circuit 1 have substantially equal DC levels but have different AC levels. This is achieved by connecting the output terminals 1a and 1b of the FM discriminator circuit 1 to ground through the DC path formed of equal resistance resistors 31 and 30 and connecting the output terminal 1b, by way of example, to ground through the AC path formed of the series connection of a variable resistor 32 and an capacitor 33. The remainder of the FM stereo demodulator circuit of FIG. 2 is constructed substantially as that of FIG. 1.

With the level adjusting circuit 17 of FIG. 2, the DC levels of the composite stereo signals provided at the output terminals 1a and 1b of the FM discriminator circuit 1 are made equal by the resistor 31 and 30 but the AC levels can be adjusted to a predetermined level ratio by adjusting the variable resistor 32. Direct current is blocked by the capacitor 33 so that the effective DC resistance between the output terminal 1b and ground is equal to the resistor 30 which is of the same resistance value as the resistor 31. But alternating current flows through the capacitor 33 so that the effective AC resistance between the output terminal 1b and ground is reduced.

Figure 9:
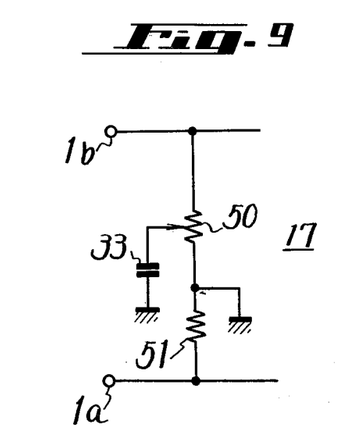
FIGS. 9 and 10 are circuit diagrams showing other embodiments of a level adjusting circuit which can be used in the FM stereo demodulator circuit shown in FIG. 2.

Other embodiments of the level adjusting circuit 17 which can be used with the present invention will now be described with reference to FIGS. 9 and 10. In the embodiment of FIG. 9, a series connection of a resistor 51 and a variable resistor 50 having a movable tap is connected between the output terminals 1a and 1b. The junction defined by the resistors is connected to ground. The movable tap of the variable resistor 50 is also connected to ground through the capacitor 33.

Figure 10:
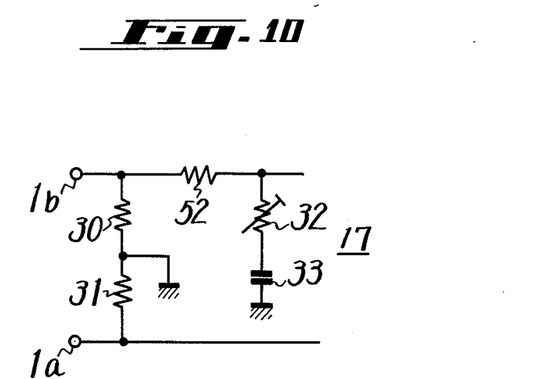

In the embodiment of FIG. 10, a resistor 52 is connected in series between the output terminal 1b and the variable resistor 32 in a modification of the level adjusting circuit 17 of the example shown in FIG. 2. In this embodiment, the composite stereo signals are adjusted in level ratio by the variable resistor 32 and the capacitor 33.

When the level adjusting circuit 17 shown in FIGS. 2, 9 or 10 is employed, the DC level of the left and right channel audio signals produced at the output terminals 29L and 29R is always made equal to zero. Therefore, in addition to the effects achieved by the embodiment described above with respect to FIG. 1, pulse noise which is caused by a DC change upon tuning is eliminated and also muting noise is eliminated.

In the aforedescribed embodiments of the invention shown in FIGS. 1 and 2, the pair of opposite polarity, different level composite stereo signals are applied to the stereo demodulator circuit 45 wherein they both are demodulated by the switching circuit SWK and the outputs of the sub-switching elements are added to the outputs of the main switching elements to cancel the crosstalk components in the left and right channel audio signals. In a further embodiment, only one of the pair of composite stereo signals is applied to the stereo demodulator circuit 45 and demodulated thereby. The level of the other composite stereo signal is suitably adjusted and, without demodulating it, is then added to the demodulated composite stereo signal to cancel the crosstalk components.

It should be recognized that the switching elements $SW_1$–$SW_4$ of the switching circuit SWK need not be limited only to the MOS FET construction. Various switching elements such as a junction type FET, bipolar transistor or the like can be used with the present invention.

While the present invention has been described with respect to certain preferred embodiments, it should be apparent that the foregoing as well as all other such changes and modifications in form and details may be made without departing from the spirit and scope of the invention. For example, the frequency discriminator is used when stereophonic signals are received as by radio transmission. If composite stereophonic signals are received from a source which does not require FM demodulation, the frequency discriminator may be replaced by other conventional apparatus to produce a pair of opposite polarity composite stereo signals. It is therefore intended that the appended claims be interpreted as including these and other such changes and modifications.

What is claimed is:

1. A method of demodulating a composite stereo signal including a main channel signal and a sub-channel signal modulated onto a carrier, comprising the steps of:

producing a pair of composite stereo signals having opposite polarities and different signal levels by attenuating the AC level of one of said pair of composite stereo signals with respect to the other while maintaining the DC levels of said pair of composite stereo signals substantially equal to establish a predetermined level ratio between said pair of composite stereo signals, said attenuated signal having a level substantially equal to said respective crosstalk components;

demodulating the one of said pair of composite stereo signals having the greater signal level to produce respective channel output signals, each output signal having a respective crosstalk component; and adding the other of said pair of composite stereo signals to said respective channel output signals to cancel said respective crosstalk component in each channel output signal.

2. The method of claim 1 wherein said step of demodulating comprises alternately switching said one of said pair of composite stereo signals to first and second output channels at a frequency equal to the frequency of said sub-channel carrier.

3. The method of claim 1 wherein said step of adding comprises demodulating said other of said pair of composite stereo signals to produce reduced amplitude respective channel output signals; and adding respective ones of said reduced amplitude channel output signals to corresponding ones of said respective channel output signals to thereby cancel said crosstalk components in said respective channel output signals.

4. A method of demodulating a composite stereo signal into respective channel output signals without accompanying crosstalk, said composite stereo signal including a main channel signal and a sub-channel signal modulated onto a carrier, comprising the steps of:

producing a pair of composite stereo signals having opposite polarities;

determining the relative signal level ratio of said pair of composite stereo signals by attenuating the AC level of one of said pair of composite stereo signals with respect to the other while maintaining the DC levels of said pair of composite stereo signals substantially constant to establish a predetermined level ratio between said pair of composite stereo signals, the signal level of the reduced amplitude composite stereo signal being substantially equal to the crosstalk component level;

demodulating the greater amplitude composite stereo signal by alternately switching it to first and second channels at a frequency equal to the frequency of said sub-channel carrier to produce first and second channel output signals, respectively;

demodulating the reduced amplitude composite stereo signal by alternately switching it to first and second terminals at said sub-channel carrier frequency to produce reduced amplitude versions of said first and second channel output signals, respectively;

adding said reduced amplitude version of said second channel output signal to said first channel output signal; and adding said reduced amplitude version of said first channel output signal to said second channel output signal.

5. Apparatus for deriving respective channel output signals from a composite stereo signal of the type including a main channel signal and a sub-channel signal modulated onto a carrier, comprising:

means for producing a pair of composite stereo signals having different signal levels;

demodulator means for receiving the one of said pair of composite stereo signals having greater signal level and for demodulating same into respective channel output signals having crosstalk components; and combining means for algebraically combining the other of said composite stereo signals with said respective channel output signals in crosstalk cancelling subtractive relation, said producing means comprising attenuating means for receiving a pair of composite stereo signals and for attenuating the signal level of one of said received composite stereo signals with respect to the other in a predetermined ratio, said attenuating means comprising AC attenuating means for attenuating the AC signal level of said one received composite stereo signal to the level of said crosstalk components, while maintaining the DC signal levels of said pair of composite stereo signals substantially equal to each other.

6. Apparatus in accordance with claim 5 wherein said combining means further comprises second demodulator means for demodulating said reduced signal level composite stereo signal into respective reduced level channel output signals; and said algebraic combining means comprises respective channel combining means each for subtractively combining a channel output signal and a corresponding reduced level channel output signal.

7. Apparatus in accordance with claim 6 wherein each of said first and second demodulator means comprises a pair of switching circuits actuated by a switching control signal having a frequency equal to and synchronized with the sub-channel carrier frequency.

8. Apparatus in accordance with claim 7 wherein said first pair of switching circuits comprises first and second switching means supplied in common with the greater signal level composite stereo signal, each of said first and second switching means being actuated by opposite phases of said switching control signal to produce first and second channel output signals, respectively; and wherein said second pair of switching circuits comprises third and fourth switching means supplied in common with the reduced signal level composite stereo signal, each of said third and fourth switching means being actuated simultaneously with said second and first switching means, respectively, by said switching control signal to produce reduced level second and first channel output signals, respectively.

9. Apparatus in accordance with claim 8 wherein said respective channel combining mmeans comprises first summing means coupled to said first and third switching means for summing, in subtractive relation, said first channel output signal and said reduced level second channel output signal, said reduced level second channel output signal cancelling the crosstalk component included in said first channel output signal; and second summing means coupled to said second and fourth switching means for summing, in subtractive relation, said second channel output signal and said reduced level first channel output signal, said reduced level first channel output signal cancelling the crosstalk component included in said second channel output signal.

10. Apparatus in accordance with claim 9 wherein each of said switching means comprises an MOS FET whose gate electrode is supplied with a corresponding phase of said switching control signal.

11. Apparatus in accordance with claim 5 wherein said AC attenuating means comprises a first resistor for receiving one of said pair of composite stereo signals; a second resistor for receiving the other of said pair of composite stereo signals, said first and second resistors being of equal resistance and connected in common to a reference potential; and a series circuit comprised of a variable resistor and a capacitor connected to said reference potential, said series circuit receiving one of said pair of composite stereo signals.

12. Apparatus in accordance with claim 5 wherein said composite stereo signal is a frequency-modulated composite stereo signal and said means for producing further comprises frequency discriminator means supplied with said frequency-modulated composite stereo signal for producing a pair of demodulated opposite polarity composite stereo signals, said opposite polarity signals being supplied to said attenuating means.

13. Apparatus in accordance with claim 12 wherein said frequency discriminator means comprises a ratio detector.

14. Apparatus for demodulating a received FM composite stereo signal into left and right channel audio signals without crosstalk, said FM composite stereo signal being of the type including a carrier modulated with at least a main channel signal and a sub-channel signal modulated onto a sub-carrier, said apparatus comprising:

FM discriminator means responsive to said FM composite signal for producing a pair of opposite polarity composite stereo signals;

signal level adjusting means for receiving said pair of opposite polarity composite stereo signals and for attenuating the signal level of one of said pair of signals with respect to the other, the attenuated signal level being substantially equal to the level of the crosstalk components;

a first pair of switching means coupled in common to said signal level adjusting means for receiving the composite stereo signal having the greater signal level and for alternately switching said composite stereo signal having the greater signal level to first and second terminals in response to opposite phases of a switch control signal respectively applied thereto to thereby produce left and right channel audio signals, said switch control signal being synchronized with said sub-carrier;

a second pair of switching means coupled in common to said signal level adjusting means for receiving the composite stereo signal having the attenuated signal level and for alternately switching said composite stereo signal having the attenuated signal level to third and fourth terminals in response to opposite phases of said switch control signal respectively applied thereto to thereby produce attenuated left and right channel audio signals;

left channel adding means coupled to one of said first and second terminals and to one of said third and fourth terminals for adding said left channel audio signal and said produced attenuated right channel audio signal; and right channel adding means coupled to the other of said first and second terminals and to the other of said third and fourth terminals for adding said right channel audio signal and said produced attenuated left channel audio signal.

* * * * *